May 9, 1967 W. TOUCHY 3,319,082

PRESSURE-SENSITIVE SEMICONDUCTOR DEVICE OF THE TRANSISTOR TYPE

Filed July 20, 1964 2 Sheets-Sheet 1

May 9, 1967 W. TOUCHY 3,319,082
PRESSURE-SENSITIVE SEMICONDUCTOR DEVICE
OF THE TRANSISTOR TYPE
Filed July 20, 1964 2 Sheets-Sheet 2

United States Patent Office 3,319,082
Patented May 9, 1967

3,319,082
PRESSURE-SENSITIVE SEMICONDUCTOR DEVICE OF THE TRANSISTOR TYPE

Wolfgang Touchy, Munich, Germany, assignor to Siemens & Halske Aktiengesellschaft, Berlin, Germany, a corporation of Germany Filed July 20, 1964, Ser. No. 383,669
Claims priority, application Germany, July 23, 1963, S 86,346
10 Claims. (Cl. 307—88.5)

My invention relates to pressure-sensitive semiconductor devices. More particularly, my invention relates to pressure-sensitive semiconductor devices of the transistor type having three sequential, differently doped regions to act as emitter, base and collector, which form two p-n junctions, the response to pressure being provided by means of a point member seated upon the emitter region directly or through the electrode bonded to that region.

It is known to utilize the pressure-sensitivity of transistors in microphones, vibration sensors, acceleration gauges, sonic pickups, hearing aids, barometers, back-pressure gauges and other measuring devices. In a known transistor microphone, a pressure point of sapphire acts upon the emitter region of a transistor having a diffused base and is connected with a diaphragm excited by sound waves to perform vibrations. The pressure variations imparted to the point from the diaphragm result in changes of the collector current. The efficiency of such pressure-responsive transistor systems is up to one-hundred times greater than that of a carbon microphone.

In the known pressure-responsive devices of this type, a high sensitivity requires applying a high pressure upon a point-like area. This tends to damage the surface of the semiconductor crystal and may result in destroying the transistor. Furthermore, the point itself is subjected to relatively rapid wear.

It is an object of my invention to eliminate these shortcomings and to achieve a high sensitivity without the necessity for applying a high pressure upon a point contact, thus also minimizing the danger of damage to the transistor.

In accordance with the present invention, the pressure member or point is seated upon a surface area of the semiconductor member which, by virtue of the position and geometry of the electrode, particularly the base electrode and emitter electrode, possesses an increased current density relative to adjacent surface areas. The locally increased current density at the point of application of the pressure may also be due to the position and geometry of the semiconductor regions contacted by the base and emitter electrodes.

The invention resulted from discoveries made in investigations performed with transistors of the planar type. This type of transistor offers among other advantages the possibility of protection of the p-n junctions by a coating of oxide at the localities where they emerge at the semiconductor surface. On transistors of silicon this coating consists of silicon dioxide. By virtue of the hard coating, planar transistors are largely insensitive to surface damage as may otherwise be caused by the pressure-imparting points.

In order that the present invention may be readily carried into effect it will now be described with reference to the accompanying drawings, wherein.

Figures 1, 2:
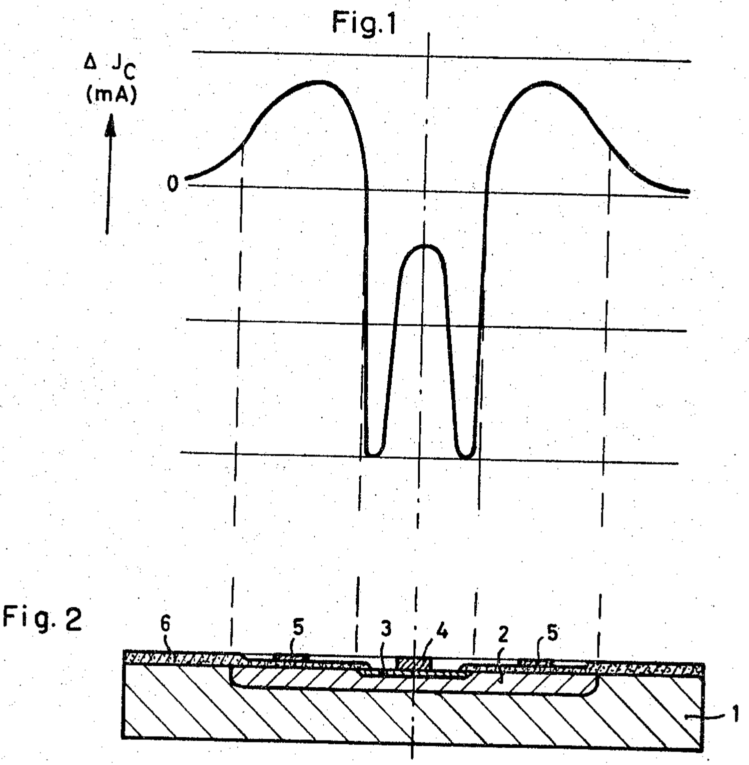
FIG. 1 is an explanatory graph.
FIG. 2 is a sectional view of a planar transistor shown in correlation to the graph of FIG. 1.

The planar transistor shown in FIG. 2 comprises a collector region 1 formed for example of n-type silicon and a diffused p-type base region 2, as well as a diffused n-type emitter region 3. Respective p-n junctions are formed between the collector region 1 and the base region 2, on the one hand, and between the base region 2 and the emitter region 3, on the other hand. The emitter region is contacted on the top surface of the semiconductor body by a contact electrode 4 consisting of a straight strip, for example, of aluminum. The contact electrode 5 for the base region may likewise consist of aluminum and may have a U-shape or horseshoe shape having two legs which straddle the emitter electrode 4.

Tests have been made with such a transistor for ascertaining the change in collector current in response to point-shaped pressure applied to respectively different points at the top surface along the cross section shown in FIG. 2. The result of a complete pressure scanning of this kind is represented by the graph in FIG. 1, in which the ordinate direction, indicated by a vertical arrow, denotes the change $\Delta J_C$ in milliamps and in which the abscissa indicates the position of pressure application along the diametrical length of the transistor.

The broken vertical lines between FIGS. 1 and 2 indicate the correlation of the pressure curve to the individual surface localities of the transistor. It will be recognized from FIG. 1 that the highest pressure sensitivity occurs in the emitter region near the edge of the emitter 3. In area-junction transistors, the highest current density exists near the emitter edge, this being due to the geometry of such transistors. It can be concluded, therefore, that a pressure control imposed upon the vicinity of the emitter edge will have maximum effect.

Accordingly, it is a basic object of the invention to modify the position and geometry of the electrode and, as the case may be, also of the semiconductor regions contacted thereby, in order to provide for surface areas that exhibit an increased current density relative to adjacent surface areas. The point of the pressure member via which variable pressure is to be applied to the semiconductor surface, is then placed into engagement with these areas of increased current density.

Figure 3:
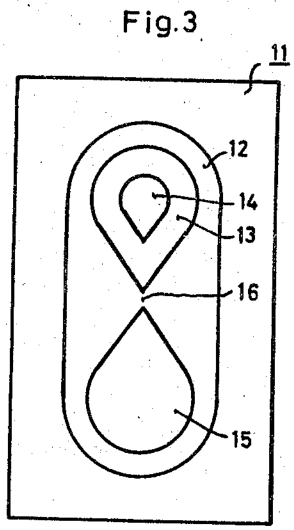
FIG. 3 is a plan view of an embodiment of the pressure-responsive transistor of the present invention.

In a preferred embodiment of such a semiconductor device, according to another feature of the invention, the emitter region and the base region are each formed with a pointed shape on the same side of the semiconductor body, with the pointed ends facing each other. An example of such an embodiment is illustrated in FIG. 3. The transistor consists, for example, of silicon and is generally similar, with reference to the arrangement of the collector, base and emitter regions, to the transistor shown in FIG. 2, being also preferably produced in accordance with known planar technique in a semiconductor body 11, for example, of n-conductivity type.

The semiconductor body 11 functions as the collector region. A p-type region 12 is produced by diffusion of donor dopants from the third group of the periodic system and functions as the base region. The top surface is then masked off, leaving the tear-drop shaped emitter area 13 exposed. The masking is preferably effected by means of a silicon dioxide coating in accordance with the planar technique. A donor element from the fifth group of the periodic system is then diffused into the surface region to produce the n-type emitter region 13. The surface of the emitter region is thereafter provided with a tear-drop shaped aluminum contact 14.

The emitter region 13 and the emitter electrode 14 have congruent shapes, the tips of the tear drops pointing in the same direction. The base region 12 is provided with another electrode 15, which is also of tear-drop shaped configuration and in the present embodiment has substantially the same size as the emitter region 13. The pointed ends of the electrodes 14 and 15 are located on a straight line and face each other. As a result, there occurs in the immediate area 16 between the two points an extremely high current density and consequently a high pressure sensitivity.

Figure 6:
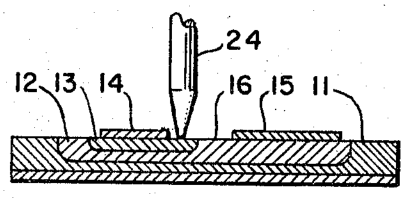
FIG. 6 is a sectional view of the embodiment of FIG. 3 showing the pressure member.

The point of the pressure member 24, as shown in FIG. 6, for imposing variable pressure upon the transistor is placed either upon the emitter electrode 14 itself or is placed in contact with the surface of the emitter region itself, but in each case is always located in the vicinity of the pointed end of the electrode or emitter region. In FIG. 6, the point 24 of the pressure transmitting member contacts the emitter region 13 in the vicinity of the point closest to the most sensitive area 16.

The increased pressure sensitivity of the singular ranges having increased current density by virtue of the position and geometry of the electrodes, offers the advantage that the pressure point may have a blunted tip. This greatly reduces the danger of damaging the surface of the semiconductor body or the pressure member by application of pressure, aside from the fact that blunted tips are also less susceptible to trouble with respect to extraneous influences.

I have found sapphire, ruby and boron carbide to be particularly well suited as point material. Molybdenum may also be utilized, although in most cases molybdenum is not preferable because it is too soft. As a rule, the tip material should be harder than the semiconductor or oxide material of silicon and silicon dioxide.

Further investigations concerning the pressure sensitivity of transistors have shown that, aside from a local dependency of the pressure sensitivity on fixed pressure spots, there is also a dependency of the pressure sensitivity on the collector direct current. In principle, the dependency of the pressure sensitivity on collector direct current is represented by the curves of FIG. 4.

Figure 4:
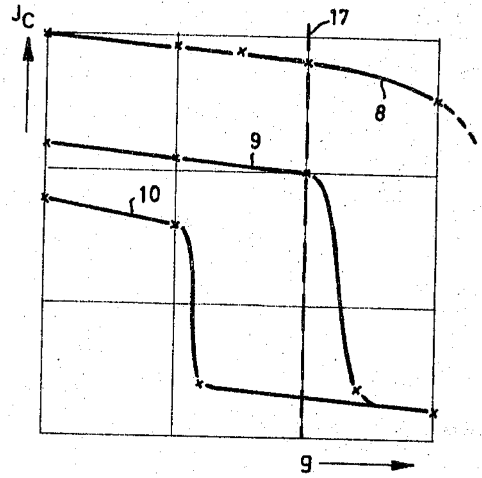
FIG. 4 is a graph relating to the performance of the embodiment of FIG. 3.

The ordinate of FIG. 4 indicates the collector current $J_C$ and the abscissa denotes the pressure in terms of weight *g*. In this, as well as in the following representations, reference is made to the dependency of the current upon the force acting upon the point, because it is only approximately possible to accurately determine the area of the point and consequently the pressure, which is the force per unit area. This also accounts for the fact that during application of pressure, the point may vary its contact area due to deformation so that the pressure is no longer proportional to the load imposed upon the point.

It will be recognized from FIG. 4 that the steep edge along which the collector current rapidly decreases and which corresponds to the area of maximum sensitivity to pressure variations, may be shifted by changing the collector current. That is, with increasing collector current, this steep edge is displaced toward higher pressure values, as is exemplified by the curves 8, 9 and 10, the curve 8 corresponding to a higher collector current than the curve 10. Since the steep portions of the curves correspond to the areas of highest pressure sensitivity, the most favorable electrical operating point for response to pressure variations can be adjusted by corresponding selection of the collector current, this adjustment being made by correspondingly adjusting the base current without application of pressure.

The curves of FIG. 4 may also be utilized for the selection of the most favorable electrical operating point by adjustment of the most favorable no-pressure current.

The curves indicate that there is a range in which the variation of the collector current by the pressure is not very large, this being the case in those portions of the curves where they exhibit only a slight slope. In curves 8 and 9, this low-sensitivity range simultaneously corresponds to a pressure range in which an elastic deformation of the semi-conductor crystal takes place; that is, in which, when the semiconductor device is relieved of the pressure, the original current value will rapidly be re-established. This range, however, is not well suited for response to pressure variations due to the slight pressure sensitivity.

The low-sensitivity range is followed by the steep decline in collector current, where the pressure sensitivity is a maximum as the curves progress with higher applied pressures. In curves 8 and 9, this high-sensitivity range corresponds to a pressure range in which a plasto-elastic deformation of the semiconductor surface occurs. That is, when the pressure loading vanishes, the current drops to a very small value only upon elapse of a finite period of time. This relaxation time of the crystal is the longer, the higher the previously applied pressure. The relaxation period imposes upon the applicable pressure variations an upper frequency limit. It is desirable, therefore, not to operate in the plasto-elastic range, but in the elastic range and nevertheless to achieve a high pressure sensitivity. The broken vertical line 17 in FIG. 4 corresponds to a pressure value of 100 kg. per $mm.^2$. It has been found that for pressures below this magnitude, an elastic deformation of the surface occurs. Pressures above this magnitude result in a plasto-elastic deformation, and at still higher pressures result in an inelastic deformation up to complete destruction not only of the surface but also within the volume of the semiconductor crystal.

It is preferable to adjust the operating current, that is, the collector current, prior to the application of pressure, in such a manner that the curves of FIG. 4 are shifted to the left to such an extent that the range of the rapidly decreasing collector current, which is the range of the highest pressure sensitivity, coincides with the elastic range, as is the case with the curve 10. In this manner, the relaxation periods are avoided.

The curves of FIG. 4 are also shifted to the left with a reduction in distance of the p-n junctions from the surface of the semiconductor body. A reduction of this distance also increases the steepness of the decrease in collector current. Consequently, the effect of the p-n junction depth upon the pressure sensitivity should also be taken into account. It has been found that with an emitter penetrating depth of 20 microns and a base penetrating depth of 60 microns, the pressure effect is still barely discernible.

In general, the p-n junction should be as close as feasible beneath the surface of the semiconductor body such as, for example, at a distance less than 1 micron. However, the distance of the p-n junctions from the surface of the semiconductor body must remain large enough to prevent them from being destroyed by the pressure from the point of the pressure-applying member. If desired, the slight distance of less than 1 micron between the p-n junction and the surface of the semiconductor body need exist only at the locality where the pressure point is seated, whereas the surrounding areas of the emitter region may have a greater thickness. The local reduction in emitter thickness may be produced, for example, by localized etching.

In a device in accordance with the present invention, it is further preferable to apply a given biasing pressure to the pressure member. The variable pressure is then superimposed upon the biasing pressure, the mechanical biasing pressure being adjusted in dependence upon the depth of the p-n junctions and the desired electrical operating point. The application of a mechanical pre-pressure upon which the variable pressure is superimposed may thus insure that even when the pressure variations are very slight, such variations occur only in a range where the collector current exhibits a steep drop and hence the device exhibits a correspondingly high sensitivity to changes in pressure.

With reference to curves 8 to 10 of FIG. 4, it should be understood that the adjustment of a lowest feasible collector current prior to applying the operating pressure results in a favorable performance. It must be borne in mind however, that when the currents become too low the transistor will no longer operate properly and the current amplification may virtually vanish. Such low values of collector current, being dependent upon the particular transistor system, must of course not be used.

Figure 5:
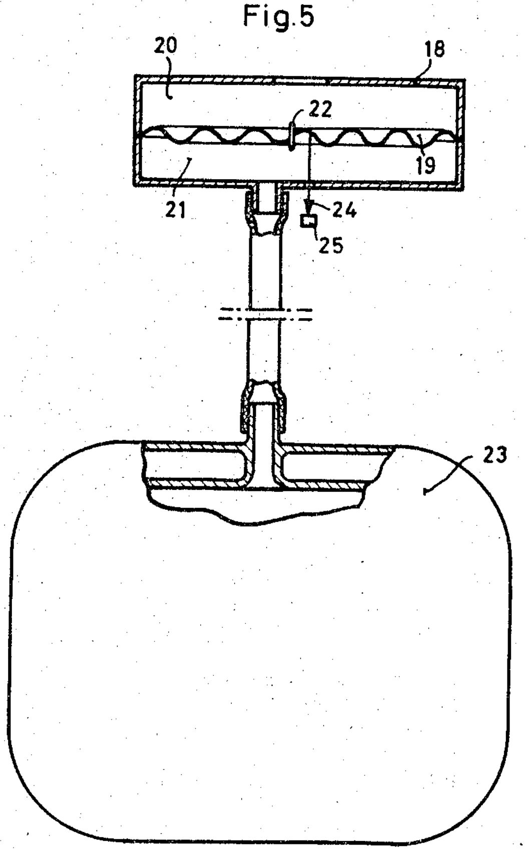
FIG. 5 is a schematic diagram, partly in section, of an embodiment of a manometric apparatus equipped with a transistor of the present invention.

Aside from the aforementioned applications for pressure-sensitive semiconductor devices, those according to the invention are also particularly well suited, on account of their high sensitivity, for use as variometers. Such instruments serve to indicate the ascent and descent of aircraft. As schematically shown in FIG. 5, they consist essentially of a capsule 18 subdivided by a diaphragm 19 into two chambers 20 and 21 of which the chamber 20 communicates with the ambient air. The other chamber 21 communicates with a pressure-equalizing volume constituted by a double-walled pressure-equalizing vessel 23.

The diaphragm 19 has a capillary opening 22 through which pressure changes in the ambient air, such as a decreasing air pressure at increasing altitude, will equalize toward the equalizing vessel. Such pressure changes cause the diaphragm 19 to deflect. The resulting force is transmitted through a point 24 to a pressure-responsive transistor 25 of the type of the present invention and thus is electrically amplified. It is a particular advantage to the pilot of the aircraft that the indication may thus also be effected readily by acoustic means.

For testing a semiconductor device according to the invention to be used as a microphone, it is advisable to connect the diaphragm, vibrating at the frequency of the sound waves, not directly with a spring that presses against the diaphragm for applying a biasing force thereto, but rather connecting the diaphragm indirectly through an air cushion with the spring. With the aid of a micromanipulator, the point or tip of the pressure member is placed in contact with the semiconductor body at the desired locality or position thereof such as, for example, on the emitter electrode or emitter region as hereinbefore described. A spring-pressure transmitter is then coupled through another spring with the pressure member for the purpose of adjusting the desired pretension or pre-pressure bias. The same bias may also be produced and adjusted with the aid of additional weights. It is preferable to adjust the pre-pressure or bias in the manner described rather than by a pre-tensioning of the diaphragm, because the latter method reduces the sensitivity of the diaphragm.

Figure 7:
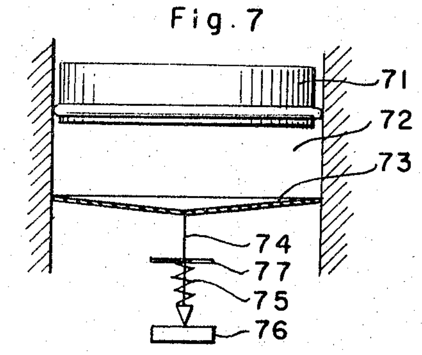
FIG. 7 is a view, partly in section, of an embodiment of a microphonic apparatus utilizing a transistor of the present invention.

The aforedescribed air cushion diaphragm arrangement is illustrated in FIG. 7, which shows an arrangement for testing a semiconductor of the present invention for use as a microphone. The diaphragm which produces the sound waves is not directly connected with the pressure applying point, but is caused to oscillate by means of a second diaphragm which is caused to oscillate through an air cushion.

In FIG. 7, an air cushion 72 is enclosed between a first diaphragm 71 and a second diaphragm. A pressure applying rod 74, terminating in a pressure applying point, is affixed to the second diaphragm 73 at its end opposite the pressure applying point and said pressure applying point contacts a semiconductor body 76.

A spring 75 is prestressed by a holder or collar 77 and applies a constant pre-pressure to the semiconductor body 76 through the pressure applying point of the pressure applying rod 74. Variable pressure via the diaphragms 71 and 73 is thus superimposed upon the constant pre-pressure applied via the spring 75 to the semiconductor body 76.

While the illustrated transistors are produced in accordance with planar techniques, it will be understood that other transistor types having p-n junctions located closely beneath the surface are also applicable for the purposes of the present invention. Such transistor types include, for example, double-diffused transistors, epitaxial transistors or mesa-type transistors.

As hereinbefore mentioned, a change in applied pressure causes a change in collector current but the base current remains virtually constant. Consequently, a pressure variation results in a corresponding change in current amplification or gain determined by the ratio $I_C/I_B$. The adjustment of the pressure, for example by corresponding choice of the biasing pre-pressure, thus also permits adjustment and control of the amplifying gain in a desired manner.

To those skilled in the art it will be obvious upon a study of this disclosure that my invention permits of various modifications and hence can be given embodiments other than particularly illustrated and described herein, without departing from the essential features of my invention and remaining within the scope of the claims annexed hereto.

I claim:

1. A pressure-responsive semiconductor device, comprising,
   a semiconductor body having three regions forming two p-n junctions and functioning as emitter, base and collector, respectively, and providing a collector current at its collector in operation;
   an emitter electrode of geometrically irregular configuration having on its periphery a substantially pointed region, said emitter electrode being in contact with the semiconductor body in the emitter region thereof;
   a base electrode of geometrically irregular configuration having on its periphery a substantially pointed region, said base electrode being in contact with the semiconductor body in the base region thereof, said base electrode and said emitter electrode being spaced from each other, the substantially pointed region of each of said emitter electrode and said base electrode being aligned with each other so as to define the shortest spacing between said emitter and base electrodes to form between them a surface area of said semiconductor body of higher current density than the adjacent surface areas of the said semiconductor body; and
   pressure means in contact with one of said emitter region and said emitter electrode in proximity with said surface area of higher current density for applying pressure to said one of said emitter region and said emitter electrode to vary the collector current provided in operation.

2. A pressure-responsive semiconductor device as claimed in claim 1, wherein each of said emitter electrode and said base electrode is of substantially ovular configuration coming to a substantial point, the point of each of said emitter electrode and said base electrode facing the other on the surface of said semiconductor body and being spaced from each other to form between them a surface area of said semi conductor body of higher current density than the adjacent surface areas of the said semiconductor body.

3. A pressure-responsive semiconductor device as claimed in claim 1, wherein one of the two p-n junctions is an emitter-base junction and the other of the two p-n junctions is a base-collector junction, and said pressure means is positioned in abutment with said semiconductor body less than one micron away from the emitter-base junction of said semiconductor body.

4. A pressure-responsive semiconductor device as claimed in claim 1, wherein said pressure means has a substantially blunt point in contact with said one of said emitter region and said emitter electrode.

5. A pressure-responsive semiconductor device as claimed in claim 1, wherein said pressure means has a point in contact with said one of said emitter region and said emitter electrode, the point of said pressure means comprising a material selected from the group consisting of sapphire, ruby and boron carbide.

6. A pressure-responsive semiconductor device as claimed in claim 1, further comprising means for applying a biasing pressure to said pressure means and means for superimposing a variable pressure upon said biasing pressure.

7. A pressure-responsive semiconductor device, comprising:

a semiconductor body having three regions forming two p-n junctions and functioning as emitter, base and collector, respectively, and providing a collector current at its collector in operation;

an emitter electrode of substantially tear-drop configuration coming to a substantial point in contact with the semiconductor body in the emitter region thereof;

a base electrode of substantially tear-drop configuration coming to a substantial point in contact with the semiconductor body in the base region thereof, said base electrode and said emitter electrode being spaced from each other with the point of each facing the point of the other on the surface of said semiconductor body and forming between them a surface area of said semiconductor body of higher current density than the adjacent surface areas of the said semiconductor body; and pressure means in contact with said emitter electrode in proximity with said surface area of higher current density for applying pressure to said emitter electrode to vary the collector current provided in operation.

8. A pressure-responsive semiconductor device as claimed in claim 7, wherein said pressure means is positioned in contact wtih said emitter electrode in proximity with the point of the said emitter electrode.

9. A pressure-responsive semiconductor device as claimed in claim 7, wherein the emitter region is of substantially tear-drop configuration of larger size than said emitter electrode and said emitter region is positioned with its point facing the point of said base electrode.

10. A method of making a pressure-responsive semiconductor device comprising a semiconductor body having three regions forming two p-n junctions and functioning as emitter, base and collector, respectively, and emitter and base electrodes on said emitter and base regions, respectively, and providing a collector current at its collector in operation, the collector current of said semiconductor device and the pressure sensitivity of said semiconductor device having a determined relation including a pressure range of elastic surface deformation of the semiconductor body wherein an elastic deformation occurs and when said semiconductor body is relieved of pressure the initial current value is rapidly reestablished, said method comprising the steps of shaping each of said emitter and base electrodes with a substantially pointed region on its periphery;

aligning the substantially pointed region of each of said emitter and base electrodes with each other so as to define the shortest spacing between said emitter and base electrodes thereby providing on said semiconductor body between said emitter and base electrodes a surface area of higher current density and higher pressure sensitivity than the adjacent surface areas of the said semiconductor body;

adjusting the collector current in operation to a value at which the operating range of maximum pressure sensitivity is shifted to the pressure range of elastic surface deformation of the semiconductor body while applying zero pressure to said semiconductor body; and applying variable pressure to the semiconductor body in the emitter region thereof.

References Cited by the Examiner

UNITED STATES PATENTS 2,632,062 3/1953 Montgomery -------- 317—235

OTHER REFERENCES

"Highly-Sensitive Microphone Uses Transistor As Base," appearing in Bell Laboratories Record, December 1962, pp. 418, 419.

JOHN W. HUCKERT, *Primary Examiner.*

A. M. LESNIAK, D. O. KRAFT, *Assistant Examiners.*